United States Patent
Hara

(10) Patent No.: US 6,862,077 B2
(45) Date of Patent: Mar. 1, 2005

(54) ANTI-VIBRATION SYSTEM FOR EXPOSURE APPARATUS

(75) Inventor: Hiromichi Hara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/263,311

(22) Filed: Oct. 3, 2002

(65) Prior Publication Data

US 2003/0030779 A1 Feb. 13, 2003

Related U.S. Application Data

(63) Continuation of application No. 09/300,521, filed on Apr. 28, 1999, now Pat. No. 6,512,571.

(30) Foreign Application Priority Data

Apr. 30, 1998 (JP) ............................. 10-134240

(51) Int. Cl.[7] ........................ G03B 27/42; G03B 27/58; G03B 27/62
(52) U.S. Cl. ............................. 355/53; 355/72; 355/75
(58) Field of Search ........................ 355/53, 67, 72–77; 310/10, 12; 248/562, 636, 550; 318/649

(56) References Cited

U.S. PATENT DOCUMENTS

| | | | |
|---|---|---|---|
| 4,473,292 A | 9/1984 | Mayer | 355/53 |
| 4,927,119 A | 5/1990 | Frost | 248/550 |
| 4,976,415 A | 12/1990 | Murai et al. | 267/136 |
| 5,121,898 A | 6/1992 | Yasuda et al. | 248/550 |
| 5,193,788 A | 3/1993 | Richter et al. | 267/227 |
| 5,356,110 A | 10/1994 | Eddy | 248/550 |
| 5,446,519 A | 8/1995 | Makinouchi | 355/53 |
| 5,502,899 A | 4/1996 | Yamaguchi et al. | 33/568 |
| 5,549,269 A | 8/1996 | Gertel et al. | 248/562 |
| 5,610,686 A | 3/1997 | Osanai | 355/72 |
| 5,765,800 A | 6/1998 | Watanabe et al. | 248/550 |
| 5,876,012 A | 3/1999 | Haga et al. | 248/550 |
| 5,881,987 A | 3/1999 | Hara | 248/550 |
| 5,931,441 A | 8/1999 | Sakamoto | 248/550 |
| 5,979,882 A | 11/1999 | Osterberg | 267/122 |
| 6,021,991 A | 2/2000 | Mayama et al. | 248/550 |
| 6,036,162 A | 3/2000 | Hayashi | 248/550 |
| 6,082,508 A | 7/2000 | Davis | 188/298 |
| 6,170,622 B1 | 1/2001 | Wakui et al. | 188/378 |

FOREIGN PATENT DOCUMENTS

| | | |
|---|---|---|
| JP | 10-89403 | 4/1989 |
| JP | 1-188241 | 7/1989 |
| JP | 3-213744 | 9/1991 |
| JP | 3-219141 | 9/1991 |
| JP | 3-245932 | 11/1991 |
| JP | 4-019438 | 1/1992 |
| JP | 4-254025 | 9/1992 |
| JP | 6-66346 | 3/1994 |
| JP | 6-074297 | 3/1994 |
| JP | 6-117487 | 4/1994 |
| JP | 6-147256 | 5/1994 |
| JP | 6-267823 | 9/1994 |
| JP | 8-35537 | 2/1996 |

*Primary Examiner*—Henry Hung Nguyen
(74) *Attorney, Agent, or Firm*—Fitzpatrick, Cella, Harper & Scinto

(57) ABSTRACT

An anti-vibration system includes air dampers of high natural frequency, in a compact space. A pair of air dampers are disposed with their driving directions opposed to each other, and inside pressures of these dampers are variably controlled so as to set the natural vibration frequency.

8 Claims, 5 Drawing Sheets

ANTI-VIBRATION SYSTEM FOR EXPOSURE APPARATUS

This is a Continuation of application Ser. No. 09/300,521 filed Apr. 28, 1999 now U.S. Pat. No. 6,512,571.

FIELD OF THE INVENTION AND RELATED ART

This invention relates generally to an exposure apparatus to be used in a semiconductor lithographic process and also to an anti-vibration system suitable for such exposure apparatus. In another aspect, the invention is concerned with a device manufacturing method to be used with such exposure apparatus.

As regards exposure apparatuses for use in production of semiconductor devices, representative examples are a step-and-repeat type exposure apparatus (called a stepper) in which, while moving a substrate (wafer or glass plate) stepwise, a pattern of an original (reticle or mask) is printed sequentially on plural exposure regions on the substrate through a projection optical system, and a step-and-scan type exposure apparatus (called a scanner) in which, through repetitions of stepwise motion and scan exposure, exposure is repeated to plural exposure regions on a substrate. Particularly, in the step and-scan type exposure apparatus, through restriction using a slit, only a portion close to the optical axis of a projection optical system is used. Therefore, it enables exposure of a fine pattern with high precision and wide picture angle. In this respect, it is expected as being a major current in near future.

SUMMARY OF THE INVENTION

These exposure apparatuses use an anti vibration system for isolating vibration from the floor on which the apparatus is mounted. In many cases, the anti-vibration system uses an air damper. Generally, an exposure apparatus has a stage system (wafer stage and reticle stage) for moving a wafer or a reticle at a high speed and then for positioning it. Thus, it is required for an anti-vibration system to insulate vibration transmitted from the floor to the exposure apparatus (i.e., isolation of vibration) and also to suppress vibration produced by the stage system itself of the exposure apparatus (i.e., reduction of vibration). In this respect, as regards the air damper, for reduction of vibration, a high natural (vibration) frequency to some extent may be desirable from the viewpoint of response to load change. On the other hand, for isolation of vibration, a natural frequency that is not so high may be desirable. Also, the optimum natural frequency of an air damper may change with load.

Recently, acceleration of a stage movement has become higher and higher for enhancement of processing speed (throughput). In step-and-scan type exposure apparatuses, for example, the stage maximum acceleration reaches 4 G for a reticle stage and 1 G for a wafer stage. Further, the mass and stroke of the stage are becoming larger with enlargement of the reticle or substrate. As a result, the driving force as defined by "mass of movable member" multiplied by "acceleration" becomes very large, and the load due to its reaction force is enormously large. Additionally, eccentric load due to stage load shift or variation thereof is also being enlarged.

In conventional air dampers, in order to increase the natural frequency to improve its vibration reduction performance, the diameter of the air damper may be enlarged to increase the pressure bearing area or, alternatively, the capacity of the air reservoir may be enlarged. If, however, the natural frequency is enlarged using this method, a larger space is required for enlargement of the air damper diameter. Also, there is a problem that the natural frequency can not be changed.

It is an object of the present invention to provide an anti-vibration system with an air damper of high natural (vibration) frequency, which is effective to save space.

It is another object of the present invention to provide an anti-vibration system in which the natural frequency of an air damper can be changed.

In accordance with an aspect of the present invention, there is provided an anti-vibration system which comprises a pair of air dampers having driving directions opposed to each other along a vertical direction, and means for controlling inside pressures of said air dampers. The inside pressure controlling means serves to change the air damper inside pressure to thereby change the natural (vibration) frequency of the air damper. The anti-vibration system may be provided with a pair of additional air dampers having driving directions opposed to each other along a horizontal direction.

The present invention is suitably usable in an exposure apparatus, particularly, a step-and-scan type exposure apparatus (scanning exposure apparatus). In that occasion, during acceleration and deceleration of a stage on which a substrate to be exposed is placed, preferably the natural frequency of the air damper may be increased as compared with that during constant speed motion, to thereby improve the vibration reduction performance. For constant speed motion (scan motion) in exposure operation, the natural frequency may preferably be made lower than that in the acceleration/deceleration operation, to thereby improve the vibration isolation performance.

In one preferred form of the present invention, an air damper has a bellows structure so that it can be moved minutely in a direction orthogonal to the driving direction. There may be a linear motor for producing a driving force in a direction parallel to the driving direction of the air damper. Provision of a linear motor enables further improvement in speed of response to displacement correction (vibration reduction) due to eccentric load.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the accompanying drawings.

Figure 1:
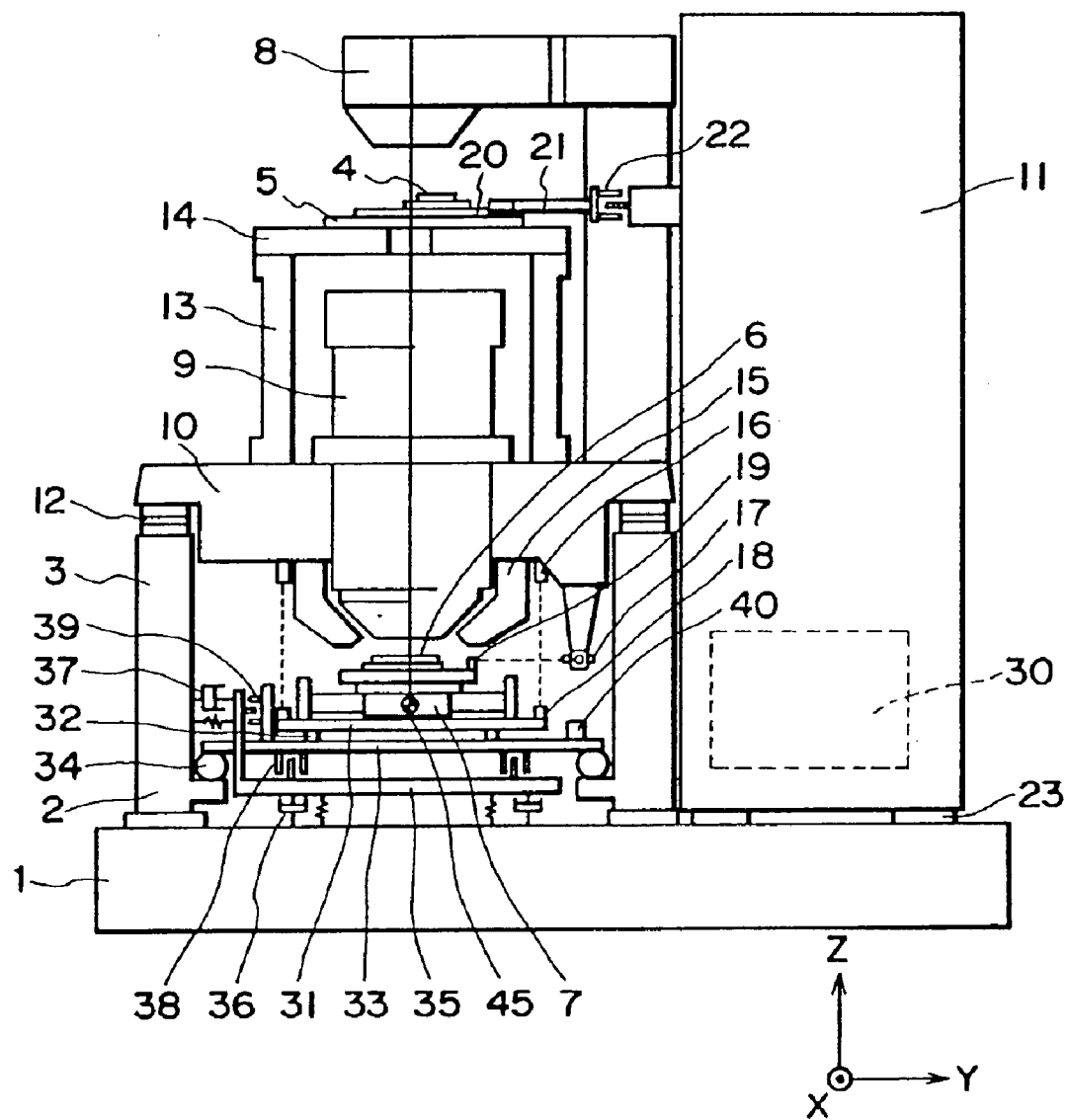
FIG. 1 is a schematic view of a scanning exposure apparatus according to an embodiment of the present invention.
Figure 2:
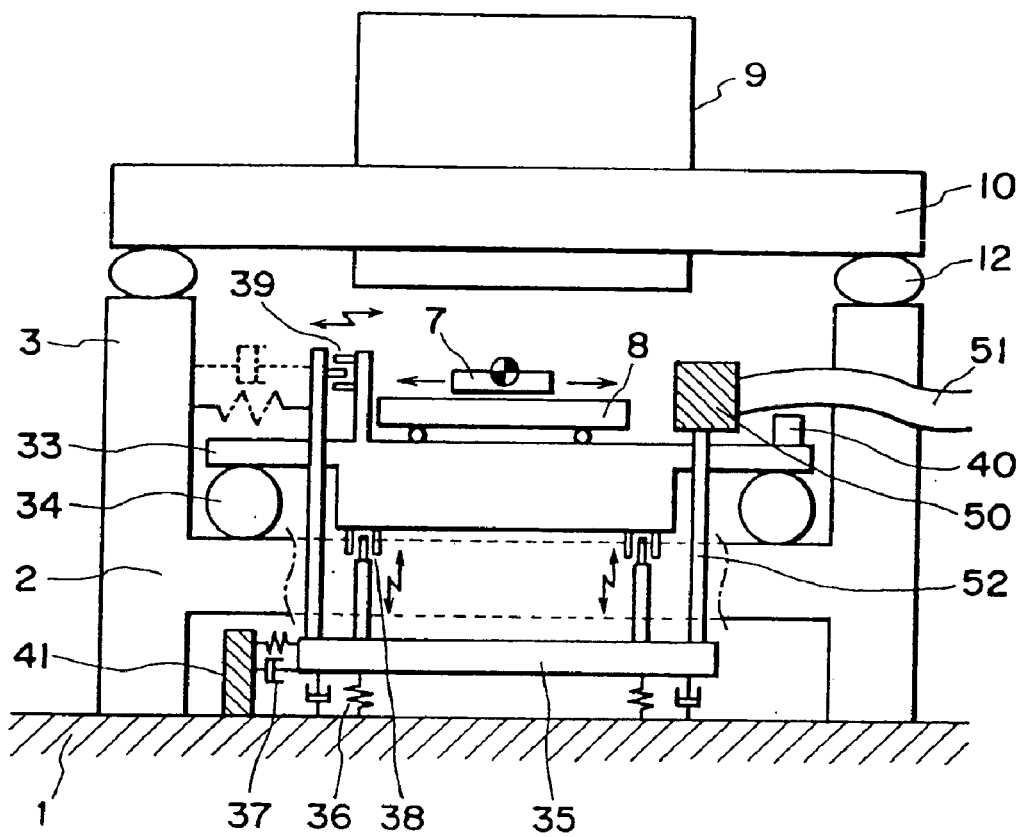
FIG. 2 is a schematic view for explaining a system for receiving a reaction force of a wafer stage, in the embodiment of FIG. 1.

FIG. 1 is a schematic view of a scanning exposure apparatus according to an embodiment of the present invention. FIG. 2 is a schematic view for explaining a reaction force receiving system for a wafer stage. Since FIG. 2 illustrates the system in a model, details are not exactly the same as those of FIG. 1.

In this embodiment, the invention is applied to a step-and-scan type scanning exposure apparatus wherein, while a reticle and a wafer are scanned in synchronism with each other, an exposure is performed so that a reticle pattern is transferred to a single shot region on the wafer, and wherein, with stepwise motion of the wafer, patterns are transferred sequentially to plural shot regions.

The exposure apparatus of FIG. 1 comprises, in general, a base frame 2 which serves as a base for the exposure apparatus major assembly, a reticle stage 5 which is movable while carrying a reticle 4 (original) thereon, a wafer stage 7 which is movable while carrying a wafer 6 or a glass plate (substrate to be exposed) thereon, an illumination optical system 8 for illuminating the reticle 4 with illumination light, a projection optical system 9 for projecting in reduced scale the pattern of the reticle 4 onto the wafer 6 with a predetermined magnification (e.g., 4:1), a barrel base 10 for holding the projection optical system 9, and an air conditioning machine chamber 11 for supplying air conditioned clean air.

The illumination optical system 8 has a light source (discharging tube such as an ultra-high pressure Hg lamp, for example) contained therein. Alternatively, illumination light is introduced via a beam line into it from a light source device (excimer laser device) disposed on the floor separately from the exposure apparatus. By using various lenses or stop means, slit-like light is produced with which the reticle 4 (original) held by the reticle stage 5 is illuminated from above.

The base frame 2 is mounted on the mount floor 1 of a clean room, in a semiconductor device production factory. The base frame 2 is fixed to the floor 1 with high rigidity, such that substantially it can be considered as being integral with or an extension of the floor 1. The base frame 2 has three or four high rigidity support pillars 3. These pillars 3 function to support, at their tops, the barrel base 10 with respect to the vertical direction, through three or four active mounts 12. Each active mount 12 comprises an air spring, a damper and an actuator contained therein. It serves to prevent transmission of high frequency vibration from the floor 1 (i.e., vibration of a frequency not lower than the natural frequency of the floor 1) to the barrel base 10. Also, it serves to actively compensate any tilt or swinging motion of the barrel base 10.

The barrel base 10 for holding the projection optical system 9 serves also to support a reticle stage base 14 through a reticle support frame 13. Further, the barrel base 10 is equipped with an alignment detector 15 for detecting the state of alignment between the reticle 4 and the wafer 6, such that alignment of these elements can be made with reference to barrel base 10. Further, for detection of the position of wafer stage 7 with reference to barrel base 10, a laser interferometer is mounted on barrel base 10. More specifically, it comprises a Z interferometer for measuring the position of the wafer stage 7 with respect to Z direction, and an X-Y interferometer 17 for measuring the position of the wafer stage 7 with respect to X and Y directions. As regards reference mirror means of the interferometer, there is a Z interference mirror 18 fixedly mounted on a wafer stage base 31, while there is an X-Y interference mirror 19 fixedly mounted on the wafer stage 7. Here, the reason why the Z interferometer mirror 18 is mounted not on a stage base member 33 but on the stage base 31 is that the stage base is close to the stage which is to be positioned finally and that, while the stage base member may be deformed slightly when force actuators 38 and 39 are actuated, the influence thereof to the stage base is small such that correct measurement is attainable.

The reticle stage 5 is mounted on the reticle stage base 14. During scanning exposure, it is moved by means of a driving mechanism having a drive source 20 (linear motor) and static bearing means, leftwardly and rightwardly (in Y direction) as viewed in the drawing, in an order of acceleration, constant-speed motion and deceleration. As will be described later, the stator of the drive source 20 (linear motor) of the reticle stage 5 is connected, along the scan direction, to the air conditioning machine chamber 11 through a connecting member 21 and a force actuator 22 (linear motor), wherein the air conditioning machine chamber 11 serves as a reaction force receiving structure for the reticle stage. Thus, variable thrust produced by the force actuator 22 can be transmitted between the drive source 20 and the air conditioning machine chamber 11.

Next, the structure of this embodiment around the wafer stage will be described. The wafer stage 7 carries a wafer (substrate) 6 thereon, and it positions the wafer 6 with respect to six axis directions, through motions along a horizontal plane (X and Y directions) and along a vertical direction (Z direction), and rotational motions (wx, wy and wz) about these directions. The drive source means for the positioning may comprise linear motors. Basically, it comprises a two-dimensional stage system having an X stage and an X linear motor for straight motion along X direction, and a Y stage and a Y linear motor for motion in Y direction orthogonal to the X direction. On this stage system, there is an additional stage which is movable in the Z direction, tilt directions (wx and wy), and rotational directions. The guide means for these directions may comprise static bearing means. For details of the wafer stage 7, reference may be made to Japanese Laid-Open Patent Application, Laid-Open No. 188241/1989, No. 245932/1991, or No. 267823/1994.

The wafer stage 7 is supported by the wafer stage base 31, and it is movable along an X-Y horizontal surface (guide surface) formed on the wafer stage base 31. The wafer stage base 31 is supported on the stage base member 33, by three or four support posts 32. Each support post 32 has a high rigidity, but has no damping function. The stage base member 33 is supported by the base frame 2, with respect to the vertical direction, at three points through three mounts 34. The load of the stage base member 33 and of the components supported thereby, is supported basically by these three mounts 34. The load thus received by the mounts 34 is then received by the base frame 2 which is substantially integral with the floor 1. Therefore, it may be considered that the basic load of the wafer stage 7 is substantively supported by the floor 1. Each mount 34 may comprise an air spring (air damper) which can bear a large load.

Figure 3:
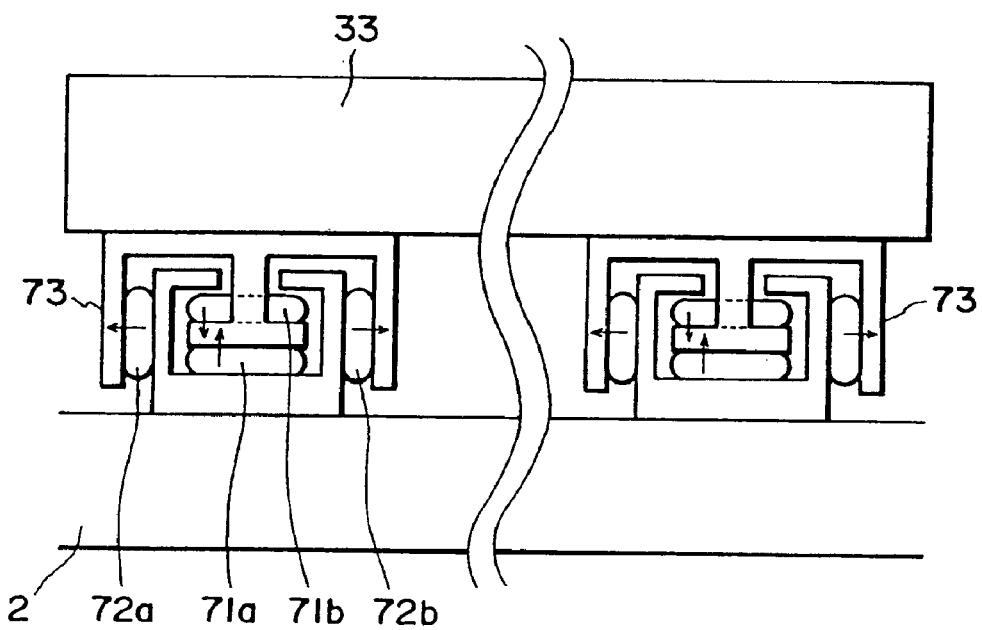
FIG. 3 is an enlarged view for explaining the structure of a mount, in an example, and use of the same.

FIG. 3 illustrates the structure of an anti-vibration system which can be used in the mount 34. Denoted at 71a and 71b are a pair of air dampers each having a driving force in the vertical direction. Here, the air dampers 71a and 71b have driving forces in opposite directions. More specifically, the air damper 71a has an upward driving force, while the air damper 71b has a downward driving force, and thus a push-pull system is provided. Also, there are air dampers 72a and 72b each having a driving force in the horizontal direction. These air dampers 72a and 72 have driving forces in opposite directions (rightward and leftward directions as viewed in the drawing), whereby a push-pull system is provided. There may be an additional air damper pair with respect to forward and backward directions, as viewed in the drawing, if necessary. Because of such use of push-pull systems, a driving characteristic can be provided without any specific directionality. Therefore, deformation of the structure of the exposure apparatus can be made small, and the time necessary for stabilization can be reduced.

Each of these dampers has a bellows structure which is in communication with an air source, having an air reservoir and a compressor, for example, through an air valve and a pipe (not shown). The air valve is connected to a control device having a sequencer (not shown). For acceleration and deceleration, the control device operates to increase the inside pressure of the air damper, higher than that for the constant speed motion, to thereby enlarge the natural frequency of the air damper. For exposure process to be performed with constant speed scan, the control device operates to decrease the inside pressure of the damper as compared with that for acceleration or deceleration, thereby to reduce the natural frequency. With this function, when a drive reaction force is large during acceleration and deceleration of the stages 5 and 7, the vibration reducing performance is increased so as to prevent transmission of vibration to the floor. During constant speed scan, on the other hand, vibration isolating performance is enlarged so as to prevent influence of vibration from the floor to the exposure process. The anti-vibration system may have a linear motor for producing a driving force in a direction parallel to the driving direction of the air damper, to provide an active damper. This enables further enhancement of vibration reducing performance.

Referring back to FIGS. 1 and 2, just below the stage base member 33, there is a reaction force bearing structure 35 (reaction force bearing palette) of large mass. Since this reaction force bearing structure 35 is disposed below the stage base member 33, the area of the floor 1 to be occupied by the apparatus can be made small.

As regards the support for the reaction force receiving structure 35, with respect to the vertical direction there are four vertically resilient supports 36 to the floor. With respect to the horizontal direction, the stage base member 33 is supported against the side face of the pillar 3 (FIG. 1), or the side face of a fixed member 41 fixed to the floor (FIG. 2) by means of horizontally resilient supports 37 which are provided in relation to X and Y directions, respectively. In FIGS. 1 and 2, only a single support 37 in the Y direction is illustrated. Each of these resilient supports 36 and 37 has a spring component and a damper component. For example, an anti-vibration rubber or air spring, or, as for the spring component, a spring member or a leaf spring and, as for the damper component, an oil viscosity or electromagnetic fluid may be suitably used. The possession of a spring component and a damping component means, in a separate sense, possession of a mechanical filter function for blocking transmission of vibration in a predetermined frequency range. In this embodiment, it functions to block transmission of high frequency vibration, including at least the natural frequency of the floor and the natural frequency of the apparatus.

Although in FIG. 1 the horizontal supports 37 are provided between the reaction force receiving structure 35 and the pillar 3 of the base frame 2, they may be disposed between a fixed member 41 fixedly mounted on the floor 1 and the reaction force receiving structure 35, as shown in FIG. 2.

Disposed between the stage base member 33 and the reaction force receiving structure 35 are force actuators for producing thrusts in vertical and horizontal directions. As regards the vertical direction, there are plural (e.g., four) vertical force actuators 38 and, with regard to the horizontal direction, there are plural (e.g., two) actuators in relation to the scan exposure direction (Y direction). When viewed from above, the four vertical force actuators 38 are placed approximately at the same positions as the four vertically resilient supports 36 (see FIG. 4 or 5). By means of the variable thrusts as produced by these force actuators, transmission of force between them can be controlled. Here, the gravity center of the wafer stage 7 (at 45 in FIG. 1) and the force acting position of the horizontal force actuator 39 are substantially at the same level. As a result, a compensating force can be applied at the same level as the reaction force. This enables effective cancellation of the reaction force.

An acceleration sensor 40 may be provided on the stage base member 33, for measurement of acceleration in vertical and horizontal (Y) directions. The acceleration sensor 40 may be mounted on the wafer stage base 31.

In this embodiment, each force actuator comprises a linear motor. Advantages of using a linear motor will be as follows. A linear motor has a good control response so that its output force can be controlled quickly. Additionally, a stator and a movable element of the linear motor are kept out of contact with each other, and a force acting therebetween is based on Lorentz force. For these reasons, the drive reaction force of the stage can be transmitted from the stage base member 33 to the reaction force receiving structure 35 while keeping a non-contact state based on Lorentz force. On the other hand, because of this non-contact, it has a mechanical filter function for blocking vibration transmission. Namely, the linear motor functions as a non-contact type actuator and also as a mechanical filter. It is therefore very suitable for this system. In place of a linear motor based on Lorentz force, the force actuator may comprise an electromagnetic actuator based on electromagnetic force, a fluid actuator based on fluid pressure such as an air pressure or hydraulic pressure, or a mechanical actuator using a piezoelectric device, for example.

In this embodiment, the reticle stage 5 and the projection optical system 9 which are made substantively integral by means of the barrel base 10, are supported relative to the floor 1 substantially in a vertical direction, by means of the active mounts 12 and through the pillars 3 of the base frame 2. On the other hand, the wafer stage 7 and the stage base member 33 are supported relative to the floor 1 substantively in a vertical direction, by means of mounts 34 and through the base frame. If the mount 34 is called a first mount while the active mount 12 is called a second mount, the wafer stage and the reticle stage are supported relative to the floor by the first and second mounts, independently of each other. Thus, there occurs no mutual interference between them in response to vibration or swinging motion.

The stage base member 33 is supported relative to the floor vertically by means of the mounts 34, while the reaction force receiving structure 35 is supported relative to the floor substantially vertically by means of the vertical resilient supports 36. Thus, except for the force actuators 38 and 39, they are supported relative to the floor independently of each other.

Figure 4:
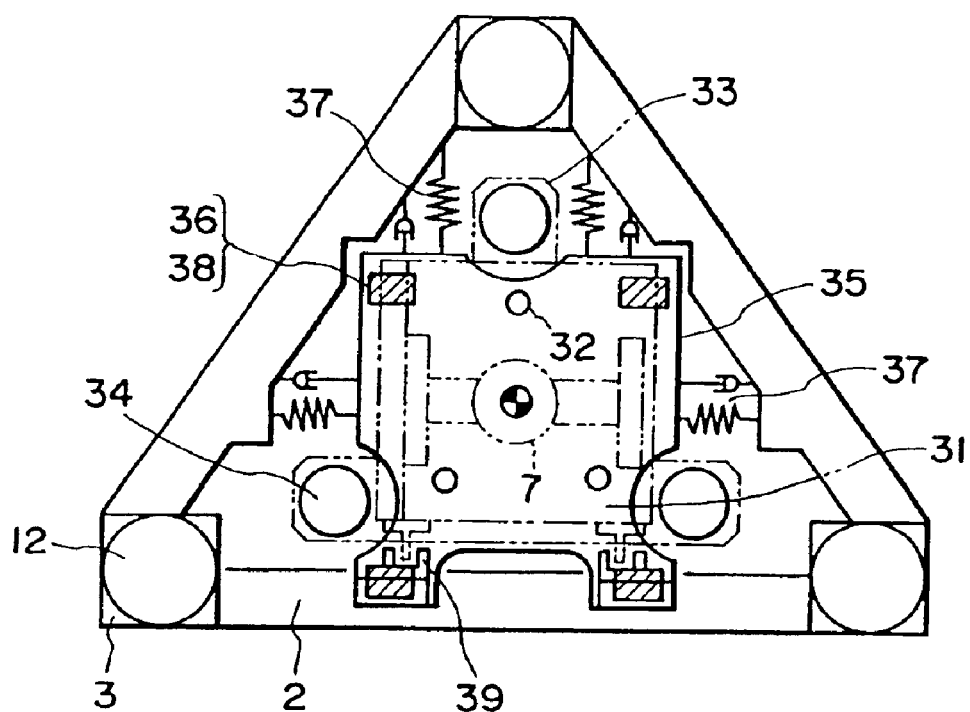
FIG. 4 is a schematic view of an example of reaction force receiving system, as viewed from the above.
Figure 5:
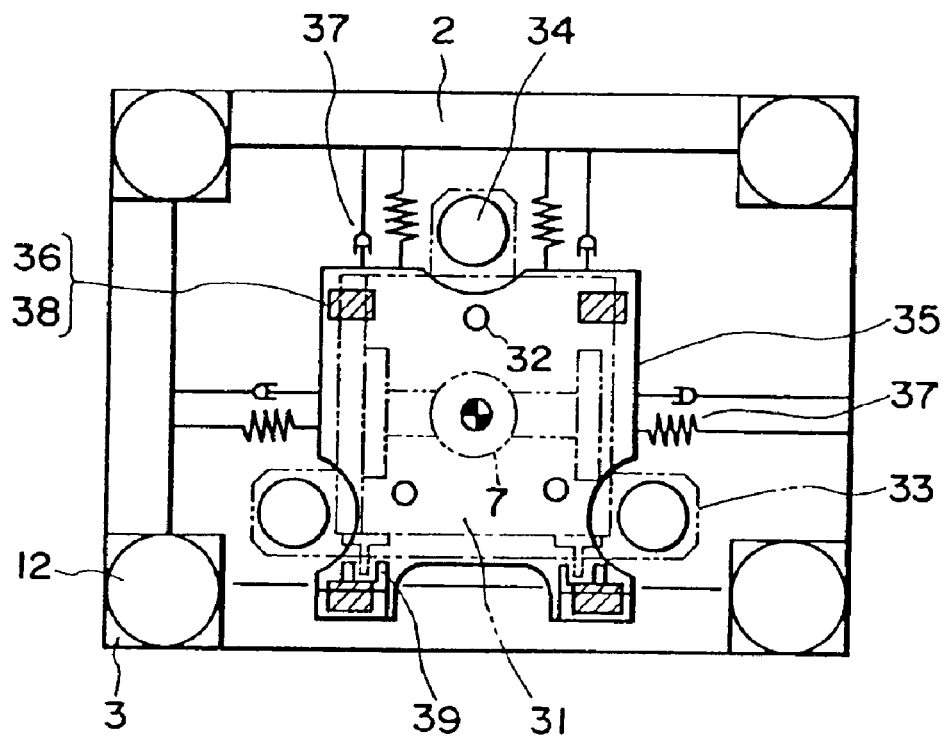
FIG. 5 is a schematic view of another example of a reaction force receiving system, as viewed from above.

FIGS. 4 and 5 each show the structural members of a reaction force receiving system, as viewed from above. FIG. 4 shows a case where the base frame 2 has three pillars 3 (three active mounts 12). When viewed from above, a triangle that connects representative points (gravity center positions) of the three mounts 34 and a triangle that connects the representative points (gravity center positions) of the three active mounts 12 both define an approximately isosceles triangle. Also, the gravity center positions of these isosceles triangles are substantially in registration with each other. Further, the optical axis (gravity center position) of the projection optical system 9 is substantially registered with the gravity center positions of these triangles.

FIG. 5 shows a case where there are four pillars 3 (four active mounts 12). When viewed from above, the triangle that connects the representative points (gravity center positions) of the three mounts 34 and the gravity center position of a rectangle (oblong) that connects representative points (gravity center positions) of the four active mounts 12 are substantially in registration with each other. Also, the optical axis (gravity center position) of the projection optical system 9 is substantially registered with their gravity center positions.

Here, if each mount 34 is called a first mount while each active mount 12 is called a second mount, when viewed from above, the positional relation is such that there are plural first mounts disposed in a region inside the plural second mounts. Further, although the wafer stage base 31 is supported on the stage base member 33 by three support posts 32, when viewed from above, there is a positional relation that the three support posts 32 are disposed in a region inside the plural first mounts 34. Furthermore, when viewed from above, the reticle stage 5 moves through the registered gravity center position described above. This structure, therefore, provides a system wherein generation of unwanted tilt in the apparatus is very small even during high-speed scanning exposure.

Referring back to FIGS. 1 and 2, the air conditioning machine chamber 11 which serves as a reaction force bearing structure for the reticle stage, is supported on the floor 1 by means of resilient supports 23 having a damper function. These resilient supports 23 can be considered as being a mechanical filter, and they function to block transmission of high frequency vibration, including at least the natural frequency of the floor (e.g., 20–40 Hz) and the natural frequency of the exposure apparatus (e.g. 10–30 Hz).

Inside the air conditioning machine chamber 11, there are a blower fan, a temperature adjusting device (heater or freezer), and a chemical filter, for example, accommodated in it. These components serve to circulate a temperature adjusted gas through the exposure apparatus chamber. Basically, the temperature controlled gas may be supplied from above, along a down flow. However, the temperature controlled gas may be blown locally toward the projection optical system 9 and the wafer stage 7 (particularly, to the laser interferometer light path). There may be blower outlet ports to this end, with gas filters for trapping fine particles in the gas. As shown in FIG. 2, there is a gas outlet port 50 to which a temperature controlled gas is supplied from the air conditioning machine chamber 11 via a duct 51. The gas outlet port 50 is supported by a support member 52 mounted on the reaction force receiving structure 35. Since the gas filter produces resistance to the flow of gas, during operation the outlet port vibrates greatly. In consideration of this, in this embodiment, the gas outlet port 50 having a gas filter is supported by the reaction force bearing structure 35 which has a large tolerance to vibration. Namely, by supporting the gas outlet port with gas filter through the reaction force bearing structure having a large tolerance to vibration, the adverse effect of transmitting vibration of the gas outlet port 50 to the positioning precision of the wafer stage 7 is reduced significantly.

Disposed in the space below the air conditioning machine chamber 11 is a control device 30 of the exposure apparatus. The control device 30 performs operation sequence control for the exposure apparatus, drive control for the force actuators, and drive control for the active mounts, for example.

The operation of the apparatus of the structure described hereinbefore, will now be explained. The basic operational sequence for step-and-scan operation comprises repetition of a stepping operation for moving the wafer stage stepwise in the X or Y direction to position a shot region to be printed, and a scanning operation for performing scan exposure while moving the reticle stage and the wafer stage in the Y direction in synchronism with each other. In the scanning operation, both the reticle stage 5 and the wafer stage 7 are moved relative to an illumination light having a slit-like shape, in synchronism with each other and at constant speeds in a predetermined speed ratio (4:1 in this embodiment), whereby the whole pattern of the reticle 4 is scanningly transferred and printed on a single shot region on the wafer 6.

In the drive of the reticle stage 5 and the wafer stage 7, acceleration is generated at the start of scan by "acceleration" and also at the end of scan by "deceleration". It is necessary for the linear motor, as a drive source for moving the stage, to produce a driving force corresponding to "mass of stage movable member" multiplied by "acceleration". The reaction force of this driving force is applied to the linear motor stator horizontally, and, from this stator, it is transmitted to the stage base member 33 through the stage base supporting the stator. The reaction force is generated only in the horizontal direction (Y direction). However, because the drive source of the stage and the gravity center position of the stage base member 33 are at different levels, a moment is produced. Because of this moment, the influence of the reaction force is applied to the stage base member 33 not only in the horizontal direction but also in the vertical direction. If this reaction force excites natural vibration of the mechanism system of the exposure apparatus, a large vibration is generated.

A fundamental concept for the reaction force receiving structure, for reducing vibration or swinging motion due to the influence of a reaction force, is that the reaction force resulting from stage driving is released toward the reaction force receiving structure which is isolated from the floor with respect to a vibration frequency in a predetermined range. The vibration frequency in the predetermined range may be one that covers at least the natural frequency of the floor (e.g., 20–40 Hz), and, as an example, it may be high frequency vibration not less than 10 Hz. Namely, vibration of the reaction force receiving structure itself is accepted in this embodiment to reduce the vibration of the floor. The value of 10 Hz is not the sole bottom limit for the predetermined range described above. It may be any one value in a range of about 10–40 Hz and not higher than the natural frequency of the floor.

In this embodiment, to accomplish the above, the exposure apparatus comprises a stage for carrying a substrate to be exposed thereon, a stage base member for supporting such stage, and a reaction force receiving structure separate from the stage base member for receiving a reaction force in response to a drive operation of the stage, wherein transmission of vibration of a frequency not less than a predetermined frequency, between the floor and the reaction force receiving structure is blocked.

Here, the control means 30 controls a drive operation of the force actuators on the basis of feed-forward control (prediction control) according to the stage drive. This may be accomplished in any one of the two ways discussed below.

First, the force actuators may be controlled with feed-forward control, in accordance with acceleration or deceleration of the stage, to thereby reduce vibration or swinging motion of the stage base member 33 due to the reaction force during acceleration or deceleration. More specifically, a force to be applied to the actuators due to the reaction force may be predicted, and then the force actuators may be controlled so as to produce an equivalent force by which the reaction force can be canceled. While the force produced by the force actuator is applied not only to the stage base member 33 but also to the reaction force receiving structure 35, since the reaction force receiving structure 35 is supported relative to the floor 1 or relative to the base frame 2 through the resilient supports 36 and 37 (corresponding to mechanical filter means), transmission of high frequency vibration to the floor 1 is filtered.

Second, the force actuators may be controlled with feed-forward control in accordance with a shift of the load resulting from the stage motion. Since the gravity center position of the stage shifts horizontally with the stage motion, the force of tilt of the stage base member 33 is applied from the stage to the stage base member 33. In order to reduce this, an eccentric load resulting from stage movement may be predicted, and the output forces of the vertical force actuators 38 may be changed individually. The load of the stage base member 33 and of moving components thereon is basically supported by the three mounts 34, and only the change in load resulting from the movement is compensated actively by the force actuators.

The control means 30 performs not only feed forward control but also feed-back control. More specifically, the acceleration (in the vertical and horizontal directions) as detected by the acceleration sensor 40 mounted on the stage base member 33 is fed back to the control of the vertical force actuators 38 and the horizontal force actuators 39, by which adverse influence of any unexpected external vibration can be reduced and swinging motion of the wafer stage 7 can be suppressed.

While the mounts 34 serve to resiliently support the stage base member 33 relative to the floor 1 or the base frame 2, the mounts 34 provide a kind of mechanical filter means. Thus, transmission of vibration from the floor to the stage base member 33 is blocked. Thus, the structure of the exposure apparatus according to this embodiment satisfies both of (1) blocking transmission of vibration due to stage drive reaction force to the floor (vibration reduction) and (2) blocking transmission of vibration of the floor to the stage (vibration isolation).

While the foregoing description has been made relative to details of the reaction force receiving system on the wafer stage side, there may be a similar reaction force receiving system on the reticle stage side. More specifically, there may be a mechanism which includes a barrel base 10 for supporting the reticle stage 5, mount means (active mount means 12) for resiliently supporting the barrel base 10 substantially vertically relative to the floor 1 or the base frame 2, a reaction force receiving structure (air conditioning machine chamber 11) including force actuators 22, for receiving a reaction force responsive to the drive of the reticle stage 5, and resilient supports 23 for resiliently supporting the reaction force receiving structure substantially vertically relative to the floor 1 or the base frame 2. The control device 30 may control the force actuators 22 through feed-forward control, to compensate for the influence of a reaction force resulting from the motion of the reticle stage 5.

Since reaction force reception can be performed for both of the wafer stage and the reticle stage, which are moved in synchronism with each other, a step-and-scan type exposure apparatus with very small floor vibration can be accomplished.

Next, an embodiment of a semiconductor device manufacturing method which uses an exposure apparatus according to any one of the preceding embodiments, will be explained.

Figure 6:
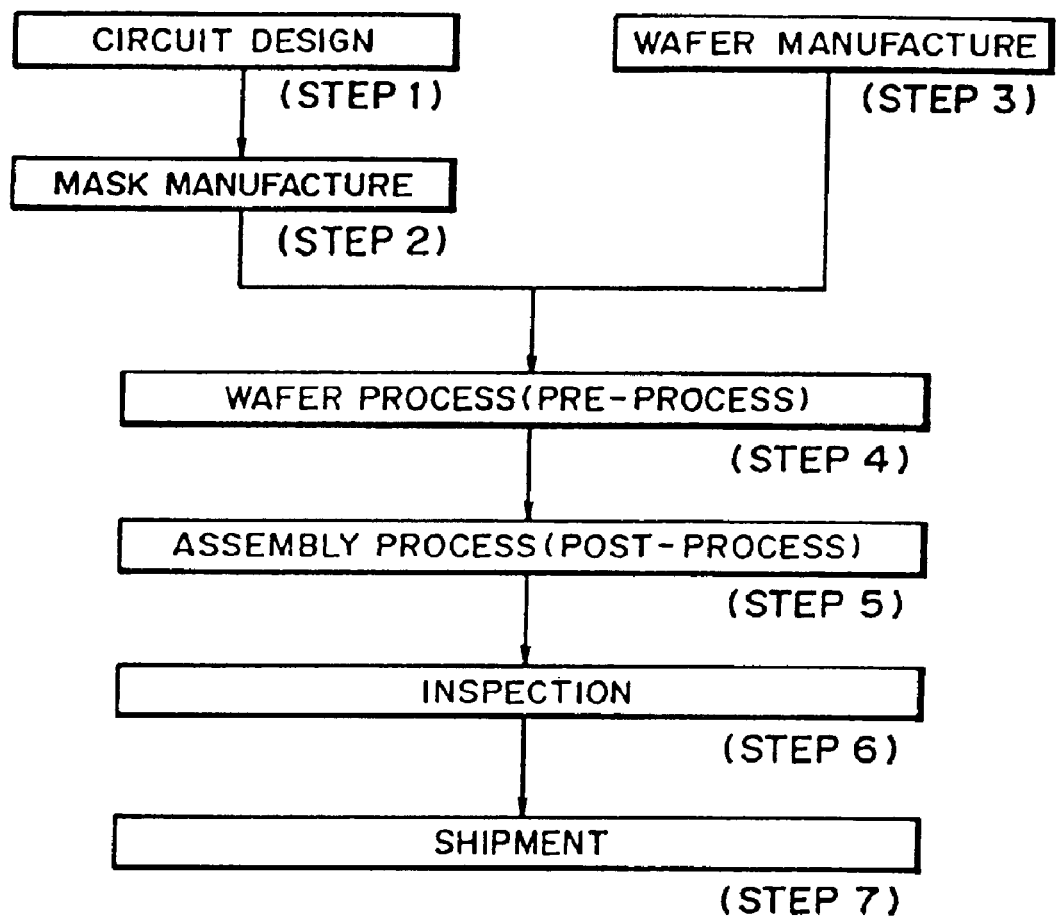
FIG. 6 is a flow chart of semiconductor device manufacturing processes.

FIG. 6 is a flow chart of a procedure for manufacture of microdevices, such as semiconductor chips (e.g. ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process, wherein, by using the prior prepared mask and wafer, circuits are formed on the wafer through lithography. Step 5 subsequent to this is an assembling step, which is called a post-process step, wherein the wafer having been processed in step 4 is formed into semiconductor chips. This step includes an assembling (dicing and bonding) process a packaging (chip sealing) process. Step 6 is an inspection step wherein operation check, durability check and the like, for the semiconductor devices provided in step 5, are carried out. With these processes, semiconductor devices are completed and they are shipped (step 7).

Figure 7:
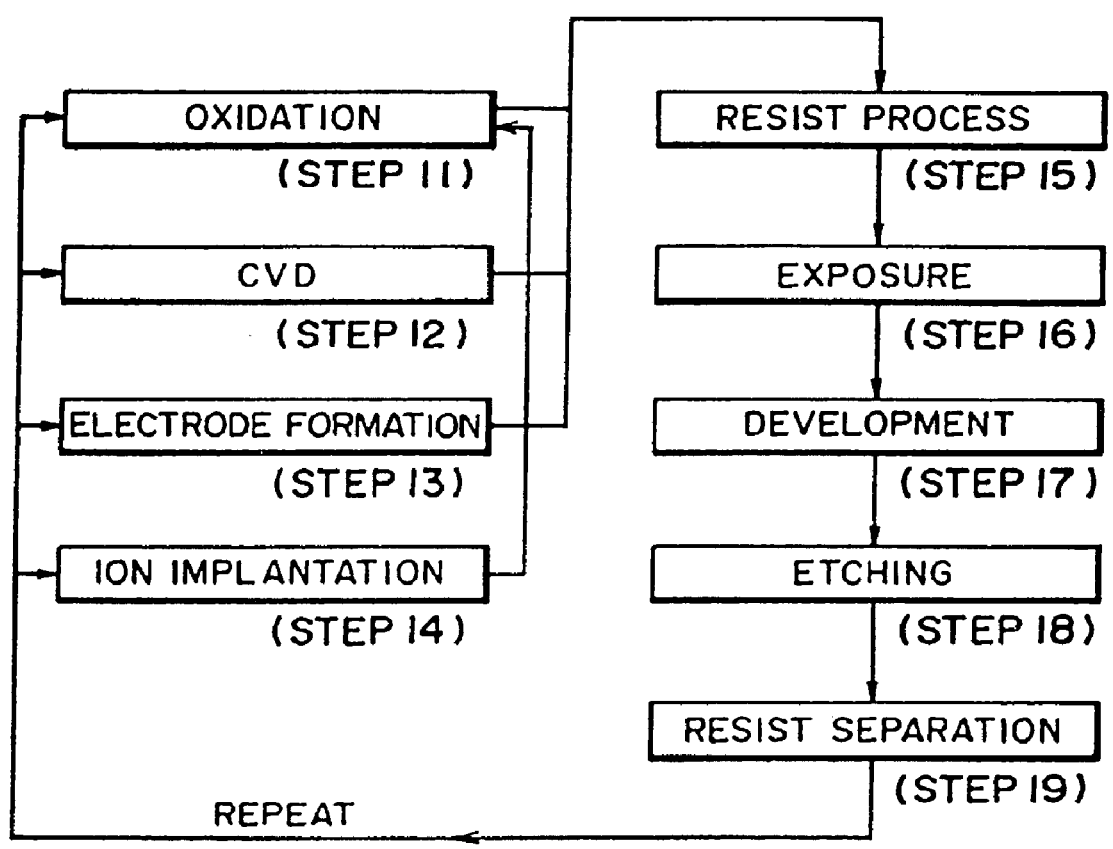
FIG. 7 is a flow chart for explaining details of a substrate process.

FIG. 7 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described mainly with respect to the mounts 34 for a step-and-scan type exposure apparatus, the present invention is not limited to this. For example, the invention is applicable with respect to the resilient supports 36 and 37, or the active mounts 12. Particularly, the inside pressure of an air damper may be controlled so as to enlarge the natural frequency of an air damper at the time of acceleration/deceleration of the stage 5 or 7 before or after the scan exposure or during stepwise motion thereof, and also to decrease the natural frequency for a constant speed motion in the scan exposure. This satisfies both vibration reduction and vibration isolation, at high level. Further, the present invention is effective when used in a laser interferometer measuring system for a step-and-repeat exposure apparatus wherein a wafer stage is moved stepwise at high speed.

As described, in accordance with the present invention, the natural frequency of an air damper can be enlarged, with small space. Further, when air dampers are used in pair to provide a push-pull system, a driving characteristic without directionality can be provided. Further, the natural frequency of the air damper can be made variable. Thus, when an anti-vibration system of this embodiment is incorporated into a scan type exposure apparatus, the natural frequency may be enlarged in acceleration or deceleration at the time of start and end of scan exposure to thereby improve the vibration reduction performance. It may be lowered for the constant speed motion for exposure, to obtain enhanced vibration isolation performance.

While the invention has been described with reference to the structures disclosed herein, it is not confined to the details set forth and this application is intended to cover such modifications or changes as may come within the purposes of the improvements or the scope of the following claims.

What is claimed is:

1. An anti-vibration system, comprising:
   a plurality of frames disposed on a first object;
   a pair of gas dampers which generate respective forces applied to one of the plurality of frames, directions of the forces being opposed to each other; and
   a controller which increases or decreases both of internal pressures of said gas dampers in accordance with a motion state of a second object which is supported by and moved relative to the first object.

2. An anti-vibration system according to claim 1, wherein the motion state corresponds to acceleration of the second object.

3. An anti-vibration system according to claim 1, further comprising a linear motor which generates a driving force applied to a frame disposed on the first object in a direction parallel to directions of the respective forces.

4. An anti-vibration system according to claim 3, further comprising a first supporting member which supports said pair of gas dampers on a floor, and a second supporting member which supports said linear motor on the floor.

5. An anti-vibration system according to claim 4, wherein said second supporting member includes a resilient member.

6. An anti-vibration system according to claim 3, wherein said linear motor generates the driving force in accordance with at least one of a motion state of the second object, a position of the second object and a motion state of the first object.

7. An exposure apparatus, comprising:
   a stage which supports an object to be exposed;
   a stage base which supports said stage; and
   an anti-vibration system which comprises:
   (i) a plurality of frames disposed on said stage base,
   (ii) a pair of gas dampers which generate respective forces applied to one of the plurality of frames, directions of the forces being opposed to each other; and
   (iii) a controller which increases or decreases both of internal pressures of said gas dampers in accordance with a motion state of said stage which is moved relative to said stage base.

8. A device manufacturing method comprising the steps of:
   exposing an object to a pattern using an exposure apparatus as recited in claim 7; and
   developing the object exposed in said exposing step.

* * * * *

UNITED STATES PATENT AND TRADEMARK OFFICE
CERTIFICATE OF CORRECTION

PATENT NO. : 6,862,077 B2
DATED : March 1, 2005
INVENTOR(S) : Hiromichi Hara

Page 1 of 1

It is certified that error appears in the above-identified patent and that said Letters Patent is hereby corrected as shown below:

Column 1,
Line 33, "anti vibration" should read -- anti-vibration --.

Column 2,
Line 54, "reaction" should read -- a reaction --.

Column 10,
Line 27, "process a" should read -- process and a --.

Signed and Sealed this

Sixteenth Day of August, 2005

JON W. DUDAS
*Director of the United States Patent and Trademark Office*